(12) United States Patent
Fumitake

(10) Patent No.: US 9,287,387 B2
(45) Date of Patent: Mar. 15, 2016

(54) STATIC MEMORY CELL AND FORMATION METHOD THEREOF

(71) Applicant: Semiconductor Manufacturing International (Shanghai) Corporation, Shanghai (CN)

(72) Inventor: Mieno Fumitake, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/687,030

(22) Filed: Apr. 15, 2015

(65) Prior Publication Data

US 2015/0311311 A1    Oct. 29, 2015

(30) Foreign Application Priority Data

Apr. 25, 2014   (CN) .......................... 2014 1 0172511

(51) Int. Cl.
*H01L 27/11*  (2006.01)
*H01L 29/66*  (2006.01)
*H01L 21/311* (2006.01)

(52) U.S. Cl.
CPC ...... *H01L 29/6681* (2013.01); *H01L 21/31144* (2013.01); *H01L 27/11* (2013.01)

(58) Field of Classification Search
CPC ................. H01L 29/6681; H01L 27/11; H01L 21/31144; H01L 21/823431; H01L 21/823821; H01L 21/845; H01L 27/0886; H01L 27/0924; H01L 2/10826; H01L 27/10879; H01L 27/1211; H01L 29/41791; H01L 29/66795; H01L 29/7831; H01L 29/785
USPC ......................................................... 438/587
See application file for complete search history.

(56) References Cited

U.S. PATENT DOCUMENTS

2014/0273397 A1*   9/2014   Rodder ................... H01L 21/76
                                                    438/400

* cited by examiner

*Primary Examiner* — Selim Ahmed
(74) *Attorney, Agent, or Firm* — Anova Law Group, PLLC

(57) ABSTRACT

The present disclosure provides a static memory cell and fabrication method. A first fin part is formed on a semiconductor substrate. An isolation layer is formed to cover a lower portion of sidewalls of the first fin part. A first dummy gate structure is formed across the first fin part. A dielectric layer is formed on the isolation layer. A mask layer is formed on the dielectric layer with a first opening to expose the top surface of the first dummy gate structure. The first dummy gate structure is removed through the first opening to form a first trench exposing the first fin part. A portion of the isolation layer is removed through the first opening to form a second trench exposing a portion of sidewalls of the first fin part below the top surface of the isolation layer. A first gate structure is formed by filling up the first and the second trenches.

17 Claims, 10 Drawing Sheets

US 9,287,387 B2

STATIC MEMORY CELL AND FORMATION METHOD THEREOF

CROSS-REFERENCES TO RELATED APPLICATIONS

This application claims the priority of Chinese patent application No. CN201410172511.1, filed on Apr. 25, 2014, the entire content of which is incorporated herein by reference.

FIELD OF THE DISCLOSURE

The present disclosure generally relates to the field of integrated circuit (IC) technology and, more particularly, relates to a static memory cell and formation method thereof.

BACKGROUND

Static Random Access Memory (SRAM) has the advantages of high speed, lower power consumption and compatibility with standard semiconductor fabrication processes. SRAMs are widely used in computers, communication devices, and consumer electronics products (e.g., smart card, digital camera, multimedia player, etc.).

As the feature sizes of the integrated circuit technology continue to shrink, multi-gate devices become more popular. For example, FinFET is widely used in SRAM transistors and enhances the performance of SRAM transistors.

FIG. 1 illustrates a schematic top view of an SRAM memory cell formed by using FinFET. FIG. 1 only shows the fin part and the gate electrode of each transistor.

The SRAM memory cell includes a first PMOS transistor P1, a second PMOS transistor P2, a first NMOS transistor N1, a second NMOS transistor N2, a third NMOS transistor N3 and a fourth NMOS transistor N4.

The first PMOS transistor P1 and the second PMOS transistor P2 are pull-up transistors. The first NMOS transistor N1 and the second NMOS transistor N2 are pull-down transistors. The third NMOS transistor N3 and the fourth NMOS transistor N4 are transfer transistors.

In a high performance SRAM memory cell with high performance, the pull-down transistors need a higher drive current than the pull-up transistors to satisfy the memory performance requirement. The ratio of the drive current among the pull-down transistors N1, N2, the pull-up transistors P1, P2, and the transfer transistors N3, N4 is approximately 2:1:1. Because the area of the transistor channel region is proportional to transistor drive current, the ratio of the area of the transistor channel region among the pull-down transistors N1, N2, the pull-up transistors P1, P2, and the transfer transistors N3, N4 is approximately 2:1:1.

In a conventional fabrication process, the fin part of a FinFET has the same height as the gate structure formed in the same SRAM memory cell. Transistors formed with a single fin part have the same channel region area. The pull-down transistors N1, N2 have two fin parts. The pull-up transistors P1, P2 and the transfer transistors N3, N4 only need one fin part. The pull-down transistors N1, N2 have twice as much channel region area as the pull-up transistors P1, P2 and the transfer transistors N3, N4. This type of SRAM structure increases the number of fin parts required to form a static memory cell, and hence fails to increase the integration density of static memory devices.

BRIEF SUMMARY OF THE DISCLOSURE

Other aspect of the present disclosure provides a method of forming a static memory cell by providing a semiconductor substrate including a first region. A first fin part is formed on the semiconductor substrate in the first region. An isolation layer is formed on the semiconductor substrate, having a top surface lower than a top surface of the first fin part to cover a lower portion of a sidewall surface of the first fin part. A first dummy gate structure is formed across a length of the first fin part. A first sidewall spacer is formed on the sidewall surface of the first dummy gate structure and on a surface portion of the isolation layer. A dielectric layer is formed on the isolation layer having a top surface coplanar with a top surface of the first dummy gate structure. A mask layer is formed on the dielectric layer and on the top surface of the first dummy gate structure. The mask layer contains a first opening to expose the top surface of the first dummy gate structure. The first dummy gate structure is removed through the first opening to form a first trench exposing a portion of a surface of the first fin part and the sidewall spacer located on both sides of the first fin part. A portion of a thickness of the isolation layer at the bottom of the first trench is removed through the first opening to form a second trench exposing a portion of sidewalls of the first fin part beneath the top surface of the isolation layer. A first gate structure is formed by filling up the first trench and the second trench in the first region.

Another aspect of the present disclosure provides a static memory cell. The static memory cell includes a semiconductor substrate having a first region and a second region. A first fin structure extends from the semiconductor substrate in the first region. A second fin structure extends from the semiconductor substrate in the second region. An isolation layer is disposed on the semiconductor substrate exposed by the first fin structure and the second fin structure. A first gate structure is disposed across a length of the first fin structure. The first gate structure covers a height of the first fin structure above a top surface of the isolation layer and covers a depth of the first fin structure below the top surface of the isolation layer. A second gate structure is disposed across a length of the second fin structure. The second gate structure covers a height of the first fin structure above a top surface of the isolation layer and does not cover a depth of the second fin structure below the top surface of the isolation layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
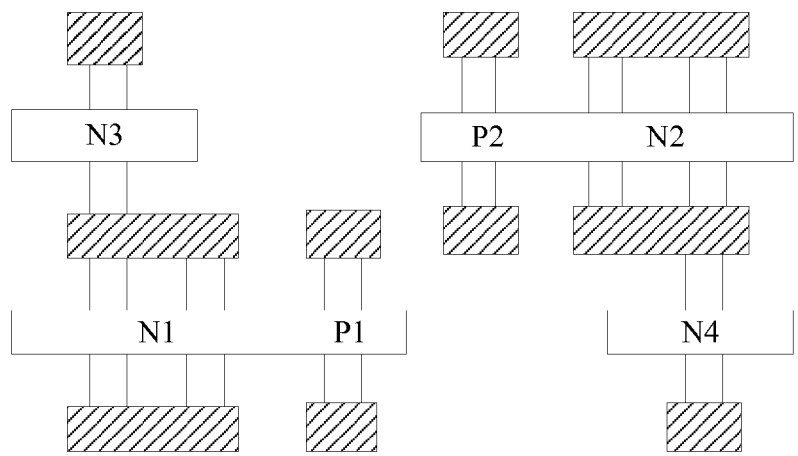
FIG. 1 illustrates a schematic top view of a conventional static memory cell.

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiments, persons of ordinary skill in the art may derive other embodiments consistent with the present disclosure, all of which are within the scope of the present invention.

Static memory cell with high performance formed in a conventional fabrication process, the pull-down transistors require two fin parts and hence affect the integration density. It is further noted that the distance between the two fin parts of the pull-down transistors N1, N2 shrinks as the feature size reduces. Constrained by the fabrication process, two fin parts separated by a very small distance may be difficult for the fabrication and have inconsistent quality in the pull-down transistors, resulting in inconsistent performance in the formed static memory cell.

In one embodiment, a plurality of the fin parts with the same height may be formed on the substrate. An isolation layer with a planarized surface may be formed to cover portion of sidewalls of the fin parts. Then the isolation layer in the region for forming pull-up transistors may be etched to increase the height of the exposed fin part. Subsequently, the gate structures of the pull-up transistors, the pull-down transistors and the transfer transistors may be formed.

Because the height of the exposed fin part in the region for forming the pull-down transistors increases, after the gate structure is formed on the fin part in the pull-down transistor region, the area of the channel region inside the fin part underneath the gate structure increases accordingly. The drive current of the pull-down transistors may then increase. By adjusting a ratio between the height of the exposed fin part in the pull-down transistor region and the height of the exposed fin part in other regions, the drive current may be made to meet the design specification of the static memory. After the gate structure is formed, a sidewall spacer may be formed on the sidewalls on both sides of the gate structure. Because the exposed fin part in the pull-down transistor region is great, a corresponding sidewall may have a great height. The sidewall spacer is typically made of high K dielectric material, the pull-down transistors may have an elevated gate parasitic capacitance as compared to transistors in other regions. Such elevated gate parasitic capacitance may affect the performance of the pull-down transistors and may eventually affect the overall performance of the static memory device.

One aspect of the present disclosure provides a method of forming a static memory cell including pull-down transistors having a high driving current formed on a single fin part without affecting the gate parasitic capacitance. Thus, the integration density and the performance of the static memory cell may be improved.

The above objectives, features and advantages of the present disclosure can be more understood with reference to the following specific embodiments of the disclosure described in detail below.

Figure 17:
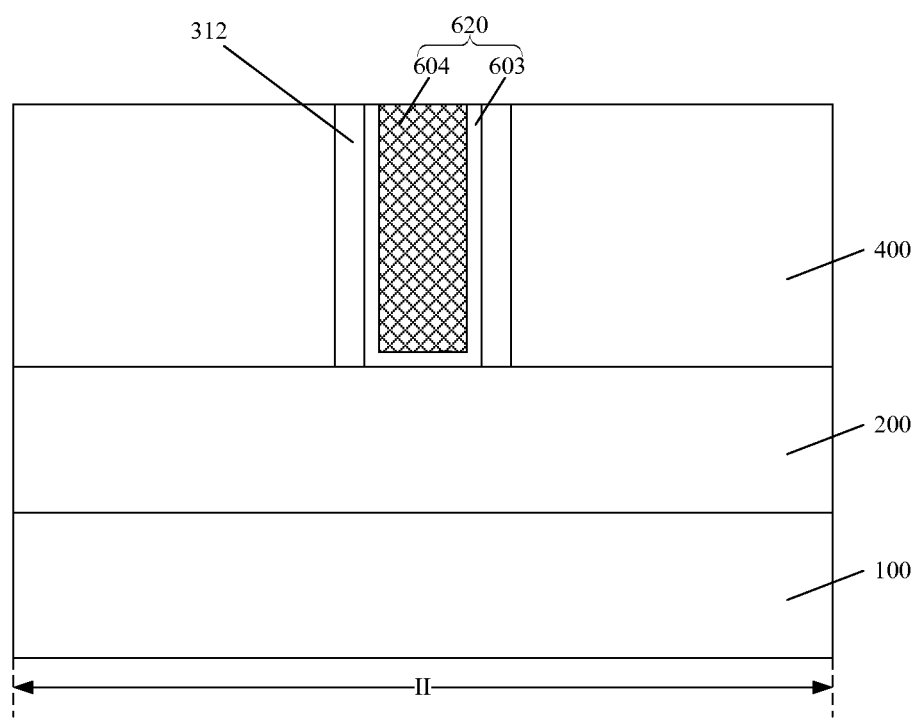
Figure 18:
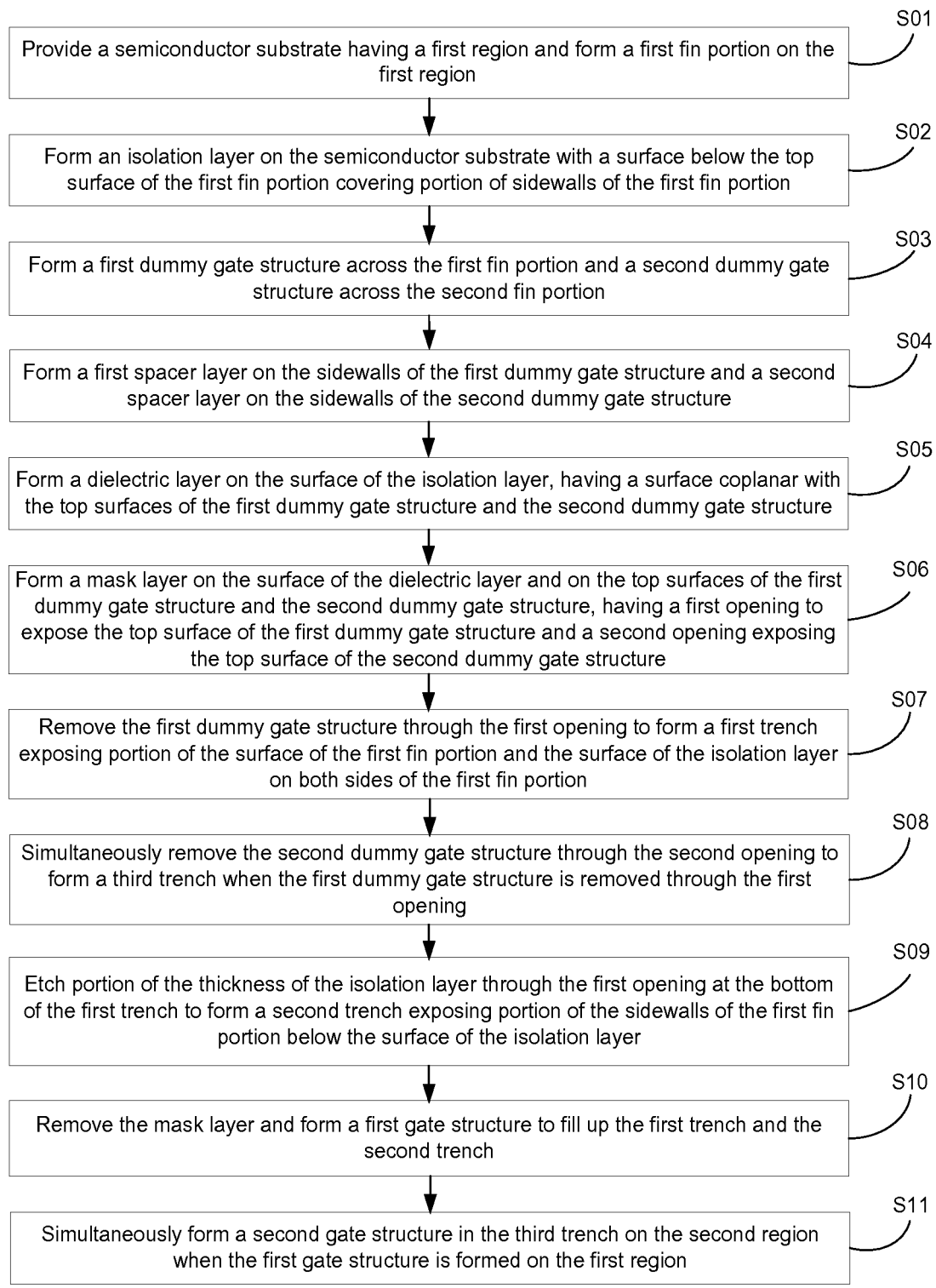
FIG. 18 illustrates a flow chart of an exemplary method for fabricating a static memory cell consistent with various disclosed embodiments.

FIGS. 2-17 illustrate cross sectional structures of an exemplary static memory cell corresponding to certain stages of a fabrication process consistent with various disclosed embodiments. FIG. 18 illustrates a flow chart of an exemplary method for fabricating a static memory cell consistent with various disclosed embodiments.

Figure 2:
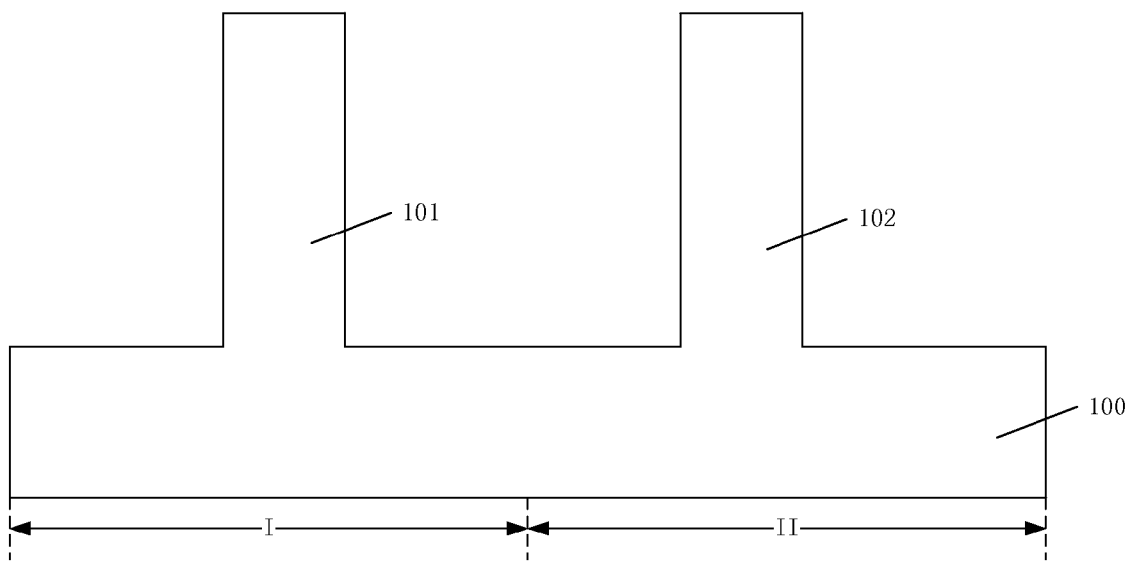
FIGS. 2-17 illustrate structures of an exemplary static memory cell corresponding to certain stages of a fabrication process consistent with various disclosed embodiments.

As shown in FIG. 18, at the beginning of the fabrication process, a semiconductor substrate having a first region I is provided. A first fin part is formed on the first region I (S01). FIG. 2 illustrates a cross-sectional view of a corresponding structure of the exemplary static memory cell consistent with various disclosed embodiments.

As shown in FIG. 2, a semiconductor substrate 100 is provided. The semiconductor substrate 100 may include a first region I, and a first fin part 101 formed on the first region I.

The semiconductor substrate 100 may be made of silicon, germanium, silicon germanium, gallium arsenide and other suitable semiconductor materials. The semiconductor substrate 100 may be made of a simple material or a composite structure such as silicon on insulator. Those skilled in the art may choose the type of the semiconductor substrate 100 depending on the semiconductor devices formed on the semiconductor substrate 100. Therefore the type of the semiconductor substrate 100 should not limit the scope of the present disclosure. In one embodiment, the semiconductor substrate 100 is made of mono-crystalline silicon.

The semiconductor substrate 100 may have a first region I for forming pull-down transistors of a static memory cell. In one embodiment, the semiconductor substrate 100 may further have a second region II.

The first region I and the second region II may be adjacent to each other or separated from each other. A second fin part 102 may be formed on the second region II. The second fin part 102 may have the same height as the first fin part 101. The second region II of the semiconductor substrate 100 may be used to form other transistors of a static memory cell, such as pull-up transistors and/or transfer transistors. The transistors to be formed on the second region II may have a smaller drive current than the transistors to be formed on the first region I.

For illustration purposes, although only one first fin part 101 and one second fin part 102 are illustrated in FIG. 2 as an example, any number of first fin parts 101 and/or second fin parts 102 may be formed based on the design structure of the static memory cell.

In another embodiment, to form the first fin part 101 and the second fin part 102, a patterned hard mask layer (not shown) may be formed on the surface of the semiconductor substrate 100. The patterned hard mask layer may define the locations and the dimensions of the first fin part 101 and the second fin part 102. Using the patterned hard mask layer as an etch mask, the semiconductor substrate 100 may be etched to form the first fin part 101 and the second fin part 102. The first fin part 101 and the second fin part 102 may have the top surfaces coplanar with each other. Then the hard mask layer may be removed. A dry etching process may be used to etch the semiconductor substrate 100 to form the first fin part 101 and the second fin part 102. The dry etching process may use an etching gas including $CF_4$, HBr, and/or $O_2$, along with a carrier gas such as He.

In other embodiments, a semiconductor epitaxial layer may be formed on the semiconductor substrate 100. The semiconductor epitaxial layer may be etched to form a first fin part 101 and a second fin part 102.

In other embodiments, after the first fin part 101 and the second fin part 102 are formed, depending on the type of transistor to be formed, the first fin part 101 and the second fin part 102 may be doped with impurity ions in order to adjust the threshold voltage of the transistor and other electrical parameters. For example, the first pull-down transistor formed on the region I may be an NMOS FinFET. Thus, a P-type threshold adjustment ion implantation may be performed to the first fin part 101 in order to improve the threshold voltage of the NMOS FinFET.

Figure 3:
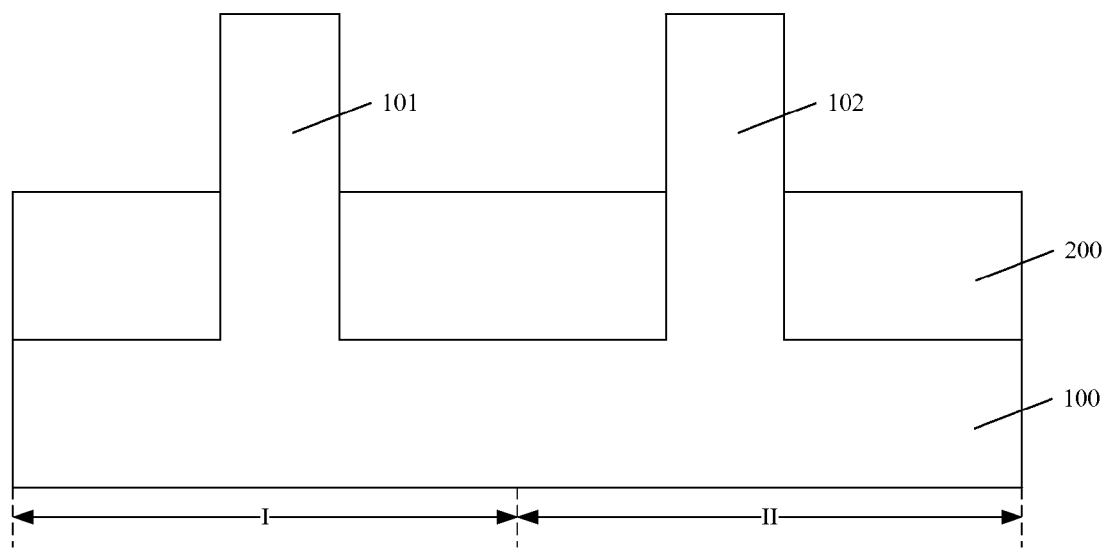

Returning to FIG. 18, an isolation layer is formed on the semiconductor substrate with a surface lower than the top surface of the first fin part to cover a lower portion of sidewalls of the first fin part (S02). FIG. 3 illustrates a cross-sectional view of a corresponding structure of the exemplary static memory cell consistent with various disclosed embodiments.

As shown in FIG. 3, an isolation layer 200 may be formed on the semiconductor substrate 100 with a surface lower than a top surface of the first fin part 101 to cover a lower portion of sidewalls of the first fin part 101.

In one embodiment, a second fin part 102 may be formed on the second region II. Thus, the surface of the isolation layer 200 may also be lower than the top surface of the second fin part 102 and may cover a lower portion of sidewalls of the second fin part 102.

The isolation layer 200 may be made of silicon oxide, silicon nitride, silicon oxycarbide, or other suitable dielectric materials. The isolation layer 200 may provide an isolation structure between adjacent fin parts and between the subsequently formed first and second gate structures and the semiconductor substrate 100. In one embodiment, the isolation layer 200 is made of silicon oxide.

To form the isolation layer 200, a chemical vapor deposition process or a spin-coating process may be used to deposit isolating a dielectric material on the surface of the semiconductor substrate 100. The isolating dielectric material may cover the first fin part 101 and the second fin part 102. The isolating dielectric material may be planarized to form an isolation material layer. The isolation material layer may have a surface coplanar with the top surfaces of the first fin part 101 and the second fin part 102. The isolation material layer may be etched back to form the isolation layer 200 shown in FIG. 2. The surface of the isolation layer 200 may be lower than the top surfaces of the first fin part 101 and the second fin part 102, to expose the top surfaces and upper portions of sidewalls of the first fin part 101 and the second fin part 102.

Figure 4:
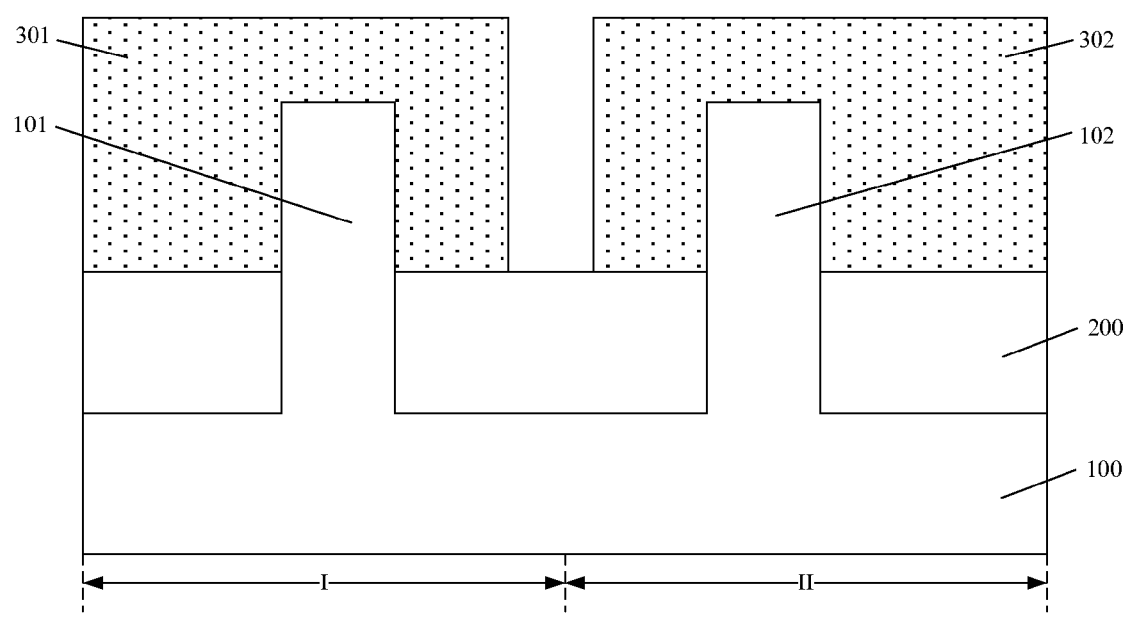

Returning to FIG. 18, a first dummy gate structure and a second dummy gate structure are formed on the isolation layer and across the first fin part and the second fin part, respectively (S03). FIG. 4 illustrates a cross-sectional view of a corresponding structure of the exemplary static memory cell consistent with various disclosed embodiments.

As shown in FIG. 4, a first dummy gate structure 301 and a second dummy gate structure 302 may be formed on the isolation layer 200 and across the first fin part 101 and the second fin part 102 respectively.

In one embodiment, the first dummy gate structure 301 may include a first dummy gate electrode located on the surface of the first fin part 101. The second dummy gate structure 302 may include a second dummy gate electrode located on the surface of the second fin part 102. The first dummy gate electrode and the second dummy gate electrode may be made of poly-silicon.

To form the first dummy gate structure 301 and the second dummy gate structure 302, a dummy gate electrode material layer may be formed on the surfaces of the isolation layer 200, the first fin part 101 and the second fin part 102 as shown in FIG. 3. The dummy gate electrode material layer may be patterned to form a first dummy gate electrode 301 across the first fin port 101 and a second dummy gate electrode 302 across the second fin part 102.

In one embodiment, the first dummy gate electrode 301 and the second dummy gate electrode 302 may be isolated from each other. In other embodiments, the first dummy gate electrode 301 and the second dummy gate electrode 302 may be a continuous structure. Adjustments may be made based on specific device structures.

In other embodiments, the first dummy gate structure 301 may further include a first dummy gate dielectric layer (not shown) located between the first fin part 101 and the first dummy gate electrode. The second dummy gate structure 302 may further include a second dummy gate dielectric layer (not shown) located between the second fin part 102 and the second dummy gate electrode. The first dummy gate dielectric layer and the second dummy gate dielectric layer may be made of silicon oxide.

Figure 5:
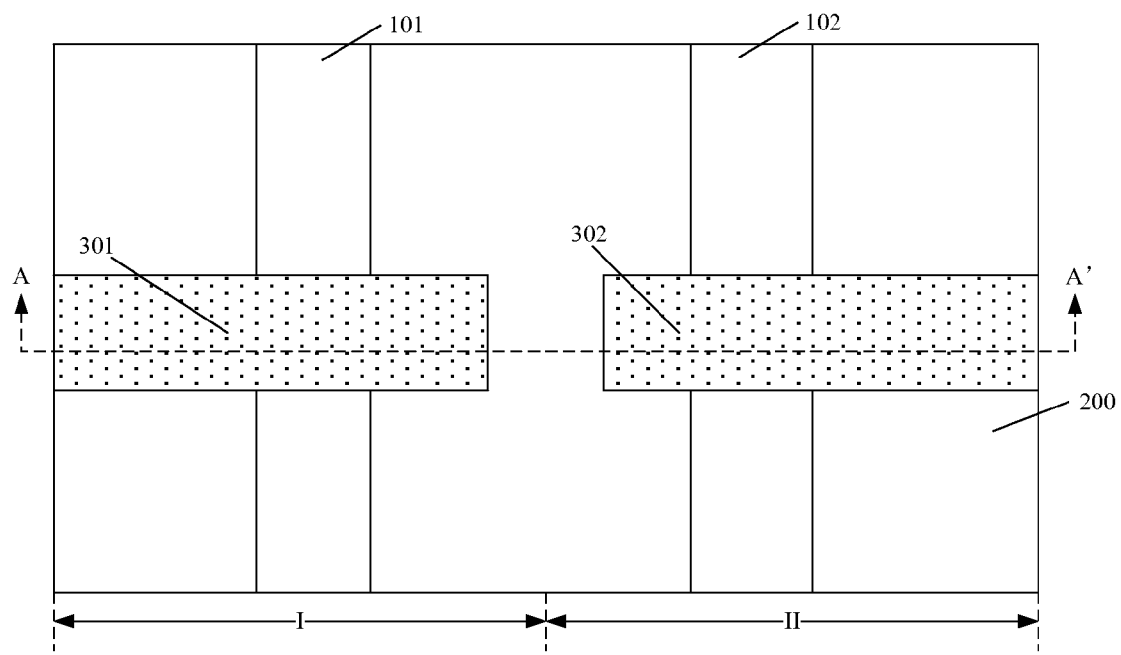

FIG. 5 further illustrates locations of the first dummy gate structure 301 and the second dummy gate structure 302. As shown, FIG. 5 is the schematic top view of the formed first dummy gate structure 301 and the second dummy gate structure 302, while FIG. 4 is a schematic sectional view along the cut line AA' in FIG. 5.

As shown in FIG. 5, the first dummy gate structure 301 is located across a length of the first fin part 101. The second dummy gate structure 302 is located across a length of the second fin part 102.

Figure 6:
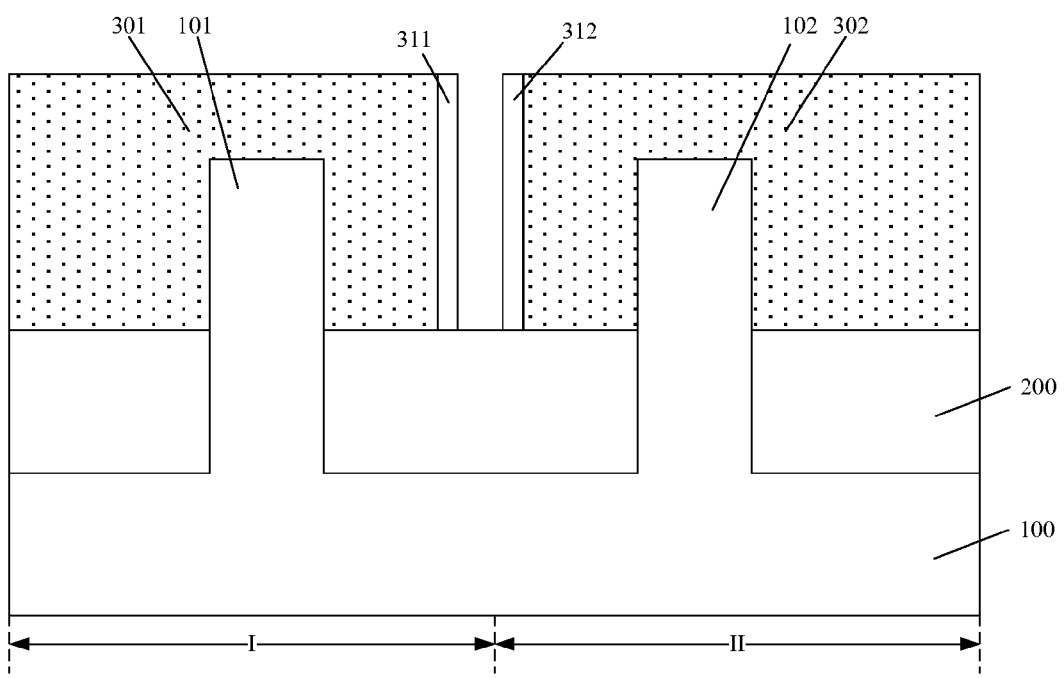
Figure 7:
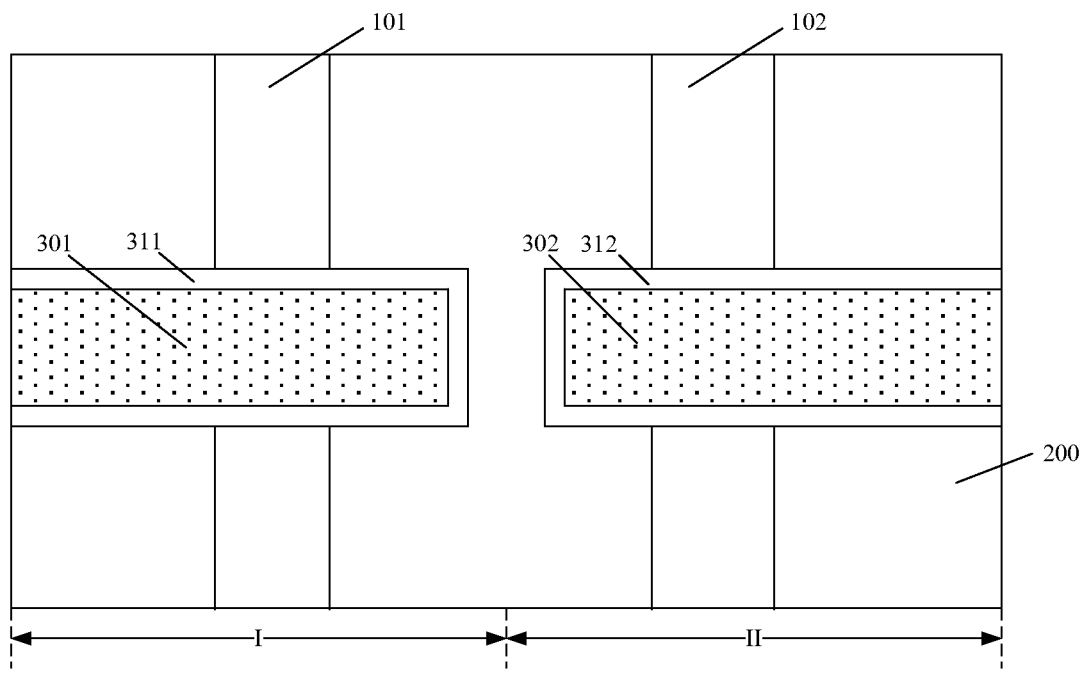

Returning to FIG. 18, a first sidewall spacer is formed on the sidewalls of the first dummy gate structure and a second sidewall spacer is formed on the sidewalls of the second dummy gate structure (S04). FIGS. 6-7 illustrate a corresponding structure of the exemplary static memory cell consistent with various disclosed embodiments.

As shown in FIGS. 6-7, a first sidewall spacer 311 may be formed on the sidewalls of the first dummy gate structure 301 and a second sidewall spacer 312 may be formed on the sidewalls of the second dummy gate structure 302. FIG. 6 illustrates the formed first sidewall spacer 311 and the second sidewall spacer 312 based on FIG. 4. FIG. 7 illustrates the formed first sidewall spacer 311 and the second sidewall spacer 312 based on FIG. 5.

The first sidewall spacer 311 and the second sidewall spacer 312 may be made of silicon nitride. The first sidewall spacer 311 and the second sidewall spacer 312 may be used to protect sidewall surfaces of the first dummy gate structure 301 and the second dummy gate structure 302.

After the first sidewall spacer 311 and the second sidewall spacer 312 are formed, a first source/drain electrode (not shown) may be formed in the first fin part 101 on both sides of the first dummy gate structure 301. A second source/drain electrode (not shown) may be formed in the second fin part 102 on both sides of the second dummy gate structure 302.

An ion implantation process may be used to form the ion doped first and second source/drain electrodes. The first sidewall spacer 311 may be used to define the distance between the first source/drain electrode and the first dummy gate structure 301. The second sidewall spacer 312 may be used to define the distance between the second source/drain electrode and the second dummy gate structure 302.

In one embodiment, because the N-type pull-down transistors are formed on the first region I, the first source/drain electrode may be doped with N-type impurity ions. The dopant type of the second source/drain electrode may be determined by the type of transistors to be formed. For example, the P-type pull-up transistors are formed on the second region II. Then the second source/drain electrode may be doped with P-type impurity ions. The N-type transfer transistors are formed on the second region II. Then the second source/drain electrode may be doped with N-type impurity ions.

Figure 8:
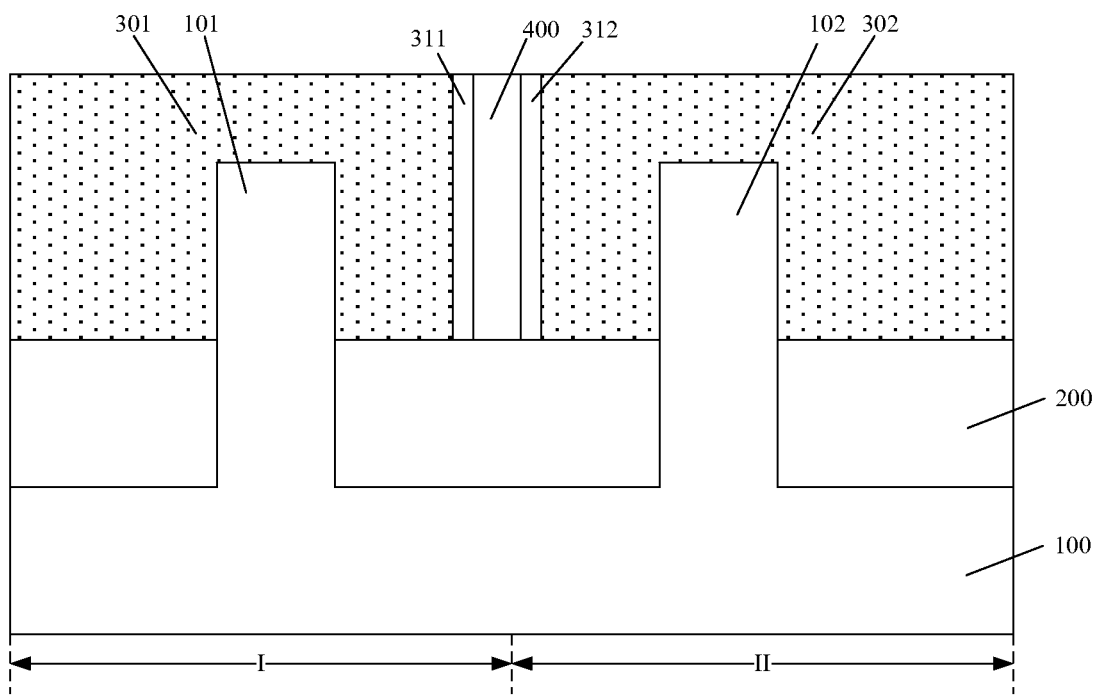

Returning to FIG. 18, a dielectric layer is formed on the surface of the isolation layer, having a surface coplanar with the top surfaces of the first dummy gate structure and the second dummy gate structure (S05). FIG. 8 illustrates a cross-sectional view of a corresponding structure of the exemplary static memory cell consistent with various disclosed embodiments.

As shown in FIG. 8, a dielectric layer 400 may be formed on the exposed surface of the isolation layer 200 between the first dummy gate structure 301 and the second dummy gate structure 302 and having a top surface coplanar with the top surfaces of the first dummy gate structure 301 and the second dummy gate structure 302.

The dielectric layer 400 may be made of silicon oxide, silicon oxycarbide, porous silicon oxide or other suitable dielectric materials. In one embodiment, the dielectric layer 400 is made of silicon oxide.

To form the dielectric layer 400, a chemical vapor deposition process may be sued to form a dielectric material layer on the surfaces of the isolation layer 200, the first dummy gate structure 301, the second dummy gate structure 302, the first fin part 101 and the second fin part 102. The top surface of the dielectric material layer may be above the top surfaces of the first dummy gate structure 301 and the second dummy gate structure 302. The dielectric material layer may be planarized to form a dielectric layer 400. The dielectric layer 400 may have a surface coplanar with the top surfaces of the first dummy gate structure 301 and the second dummy gate structure 302.

Figure 9:
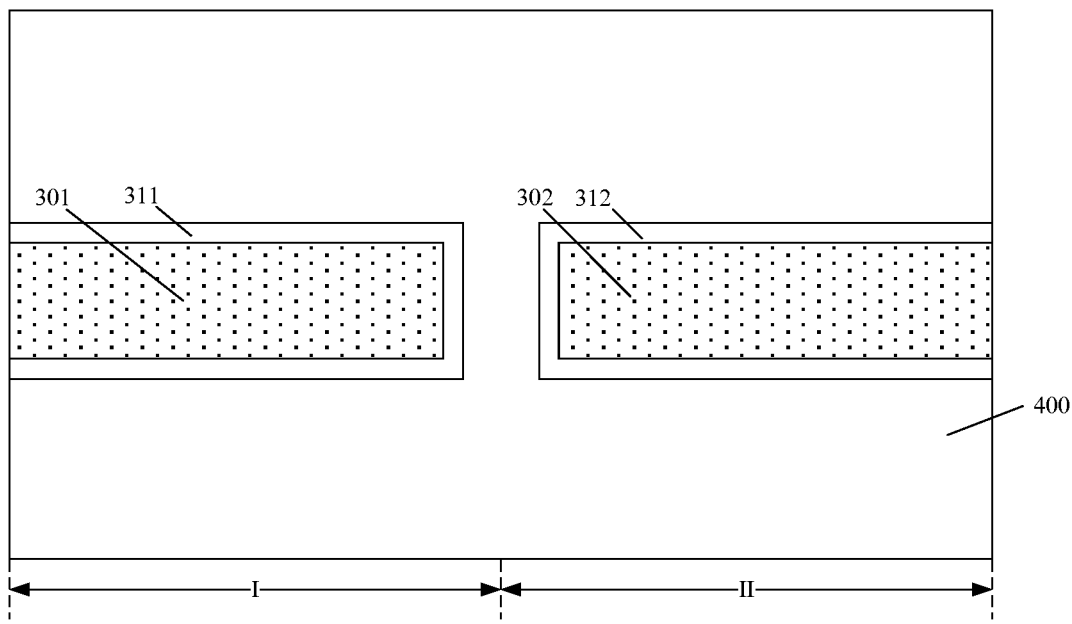

FIG. 9 illustrates the schematic top view of the form dielectric layer 400. The dielectric layer 400 may expose the top surfaces of the first dummy gate structure 301, the first sidewall spacer 311, the second dummy gate structure 302 and the second sidewall spacer 312.

Figure 10:
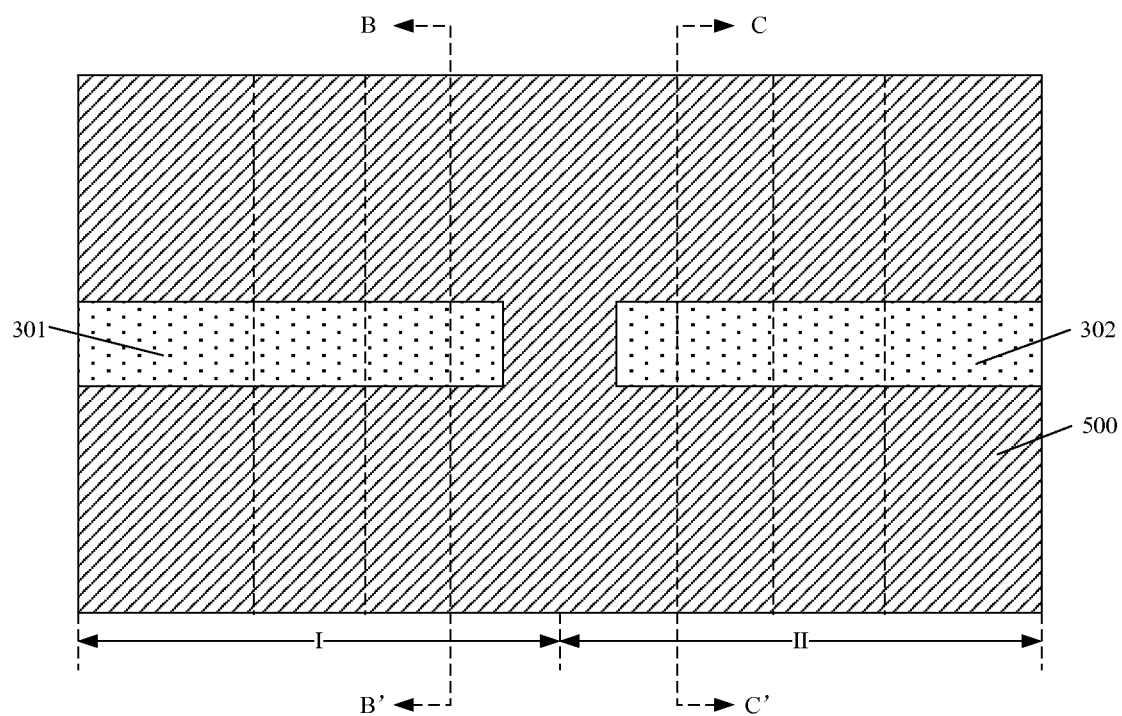
Figure 11:
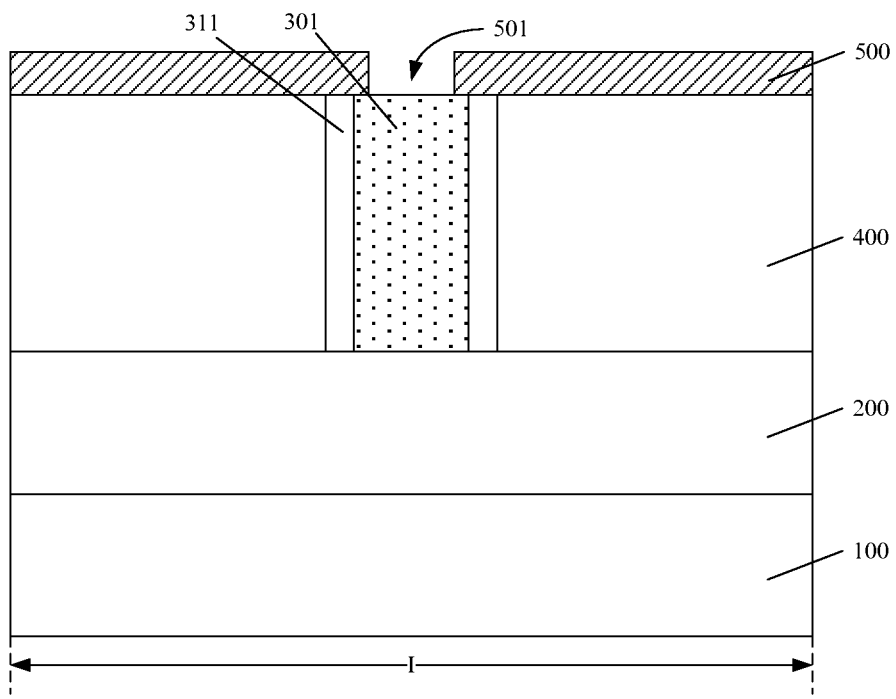
Figure 12:
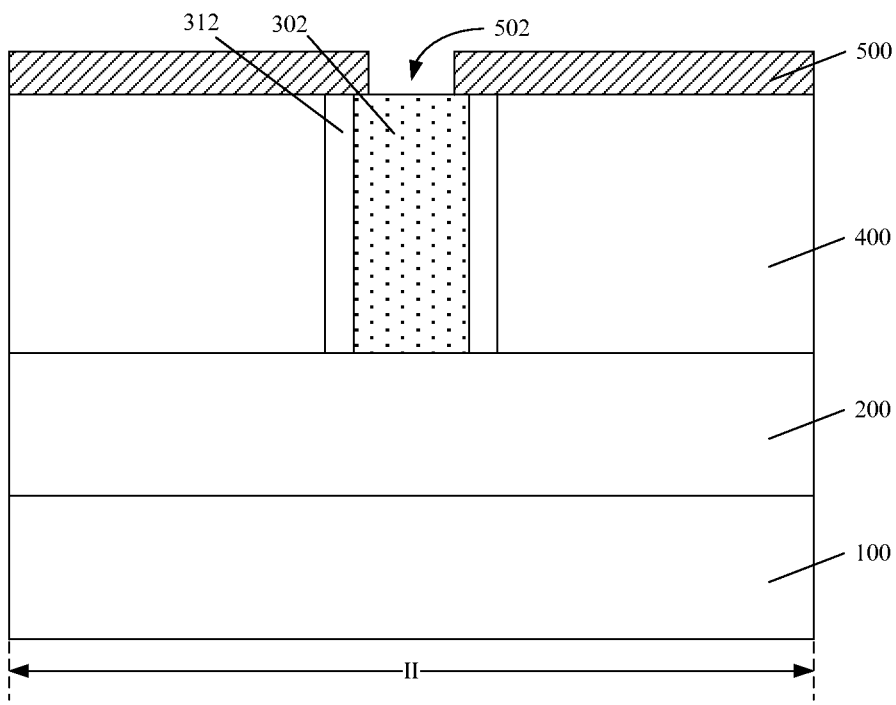

Returning to FIG. 18, a mask layer having a first opening and a second opening is formed on the surface of the dielectric layer and on the top surfaces of the first dummy gate structure and the second dummy gate structure, and the first opening exposes the top surface of the first dummy gate structure and the second opening exposes the top surface of the second dummy gate structure (S06). FIGS. 10-12 illustrate a corresponding structure of the exemplary static memory cell consistent with various disclosed embodiments.

As shown in FIGS. 10-12, a mask layer 500 having a first opening 501 and a second opening 502 may be formed on the surface of the dielectric layer 400 and on the top surfaces of the first dummy gate structure 301 and the second dummy gate structure 302. The first opening 501 exposes the top surface of the first dummy gate structure 301 and the second opening 502 exposes the top surface of the second dummy gate structure 302.

FIG. 10 illustrates the schematic top view of the formed mask layer 500. The dotted lines on the first region I enclose the first fin part 101 (referring to FIG. 8) and the dotted lines on the second region II enclose the second fin part 102 (referring to FIG. 8).

FIG. 11 illustrates the cross-sectional side view along the cut line BB' shown in FIG. 10. FIG. 12 illustrates the cross-sectional side view along the cut line CC' shown in FIG. 10. FIGS. 11-12 show more clearly the locations of the first opening 501 and the second opening 502 respectively in the mask layer 500.

To form the mask layer 500, a mask material layer may be formed on the surfaces of the dielectric layer 400, the first dummy gate structure 301, the first sidewall spacer 311, the second dummy gate structure 302 and the second sidewall spacer 312. A patterned photoresist layer may be formed on the surface of the mask material layer. The patterns of the patterned photoresist layer may define the locations and the dimensions of a first opening 501 and a second opening 502 to be formed. The patterned photoresist layer may be used as an etch mask to etch the mask material layer to form a mask layer 500 having the first opening 501 and the second opening 502.

The first opening 501 may have a width narrower than or equal to the width of the first dummy gate structure 301. The second opening 502 may have a width narrower than the width of the second dummy gate structure 302. The first opening 501 may have a width of approximately ½ to ⅘ of the width of the first dummy gate structure 301. The second opening 502 may have a width of approximately ½ to ⅘ of the width of the second dummy gate structure 302. The first opening 501 and the second opening 502 may have the same or different width.

In one embodiment, the first dummy gate structure 301 may have a width of approximately 20 mm to 25 mm. The first opening 501 may have a width of approximately 15 mm to 20 mm. The second dummy gate structure 302 may have a width of approximately 20 mm to 25 mm. The second opening 502 may have a width of approximately 15 mm to 20 mm.

Because the mask material layer may be inaccurately etched to form the first opening 501 and the second opening 502, the locations and the dimensions of the formed first opening 501 and the second opening 502 may deviate from the design specification. When the first opening 501 has the same width as the first dummy gate structure 301 and the second opening 502 has the same width as the second dummy gate structure 302, the locations of the first opening 501 and the second opening 502 may shift when an etching error occurs. The first opening 501 and the second opening 502 may thus have a width wider than the design specification and may expose the first sidewall spacer 311, the second sidewall spacer 312 and even the dielectric layer 400. Thus, the first sidewall spacer 311, the second sidewall spacer 312 and/or the dielectric layer 400 may be damaged in the subsequent fabrication process. The performance of the formed static memory cell may be affected.

The first opening 501 may have a width narrower than the width of the first dummy gate structure 301 and the second opening 502 may have a width narrower than the width of the second dummy gate structure 302. When an etching error occurs, the formed first opening 501 may still fall within the top surface of the first dummy gate structure 301 and the formed second opening 502 may also fall within the top surface of the second dummy gate structure 302.

Figure 13:
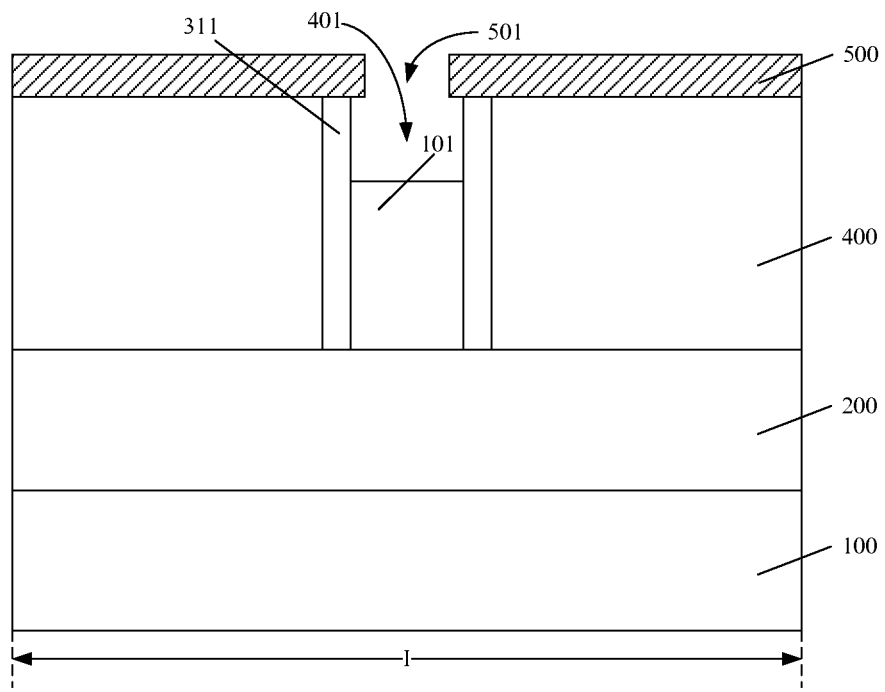

Returning to FIG. 18, the first dummy gate structure is removed through the first opening to form a first trench exposing portion of the surface of the first fin part and the surface of the isolation layer on both sides of the first fin part (S07). FIG. 13 illustrates a cross-sectional view of a corresponding structure of the exemplary static memory cell consistent with various disclosed embodiments.

As shown in FIG. 13, the first dummy gate structure 301 (referring to FIG. 11) may be removed through the first opening 501 to form a first trench 401 exposing portion of the surface of the first fin part 101 and the surface of the isolation layer 200 on both sides of the first fin part 101 (not shown in FIG. 13). FIG. 13 illustrates the schematic side view of the structure shown in FIG. 11 after the first dummy gate structure is removed.

In one embodiment, to remove the first dummy gate structure 301, an anisotropic etching process may be used to etch the first dummy gate structure 301 through the first opening 501 to remove the portion of the first dummy gate structure 301 underneath the first opening 501 exposing portion of the surface of the first fin part 101. Then an isotropic etching process may be used to etch the remaining first dummy gate structure 301 underneath the mask layer 500 on both sides of the first opening 501 to completely remove the first dummy gate structure 301 and to expose surface portion of the isolation layer 200.

In one embodiment, because the first opening 501 has a width narrower than the width of the first dummy gate structure 301, the first opening 501 may only expose portion of the top surface of the first dummy gate structure 301 and the rest of the first dummy gate structure may be covered by the mask layer 500. At first, an anisotropic etching process may be used to remove the exposed portion of the first dummy gate structure 301. Then an isotropic etching process may used to remove the remaining first dummy gate structure 301 covered by the mask layer 500 to form a first trench 401. The anisotropic etching process may be a dry etching process. The dry etching process has a high etching efficiency and improves the efficiency of removing the first dummy gate structure 301.

The anisotropic etching process may have a pressure ranging approximately from 10 mTorr to 50 mTorr, a power ranging approximately from 500 W to 750 W, a $CF_4$ gas flow rate ranging approximately from 50 sccm to 200 sccm, a HBr gas flow rate ranging approximately from 100 sccm to 1000 sccm, a He gas flow rate ranging approximately from 200 sccm to 1000 sccm, an $O_2$ gas flow rate ranging approximately from 5 sccm to 20 sccm, a temperature ranging approximately from 40° C. to 80° C., and a bias voltage ranging approximately from 100 V to 250 V.

The isotropic etching process may be a wet etching process. The wet etching process may have an etching solution of tetramethylammonium hydroxide, a mass concentration ranging approximately from 1% to 5% and a temperature ranging approximately from 50° C. to 80° C.

In other embodiments, only wet etching process may be used to remove the first dummy gate structure 301 through the first opening 501. However, compared to the desirable method, using only the wet etching process may have a low etching efficiency and may take longer etching time.

In other embodiments, the first opening 501 may have the same width as the first dummy gate structure 301 to completely expose the top surface of the first dummy gate structure 301. Thus, only anisotropic etching process may be used to remove the first dummy gate structure 301 through the first opening 501.

After the first dummy gate structure 301 is removed, a first trench may be formed. The first trench 401 may have a width equal to the width of the first dummy gate structure 301 to expose portion of the surfaces of the first fin part 101 and the isolation layer 200.

Figure 14:
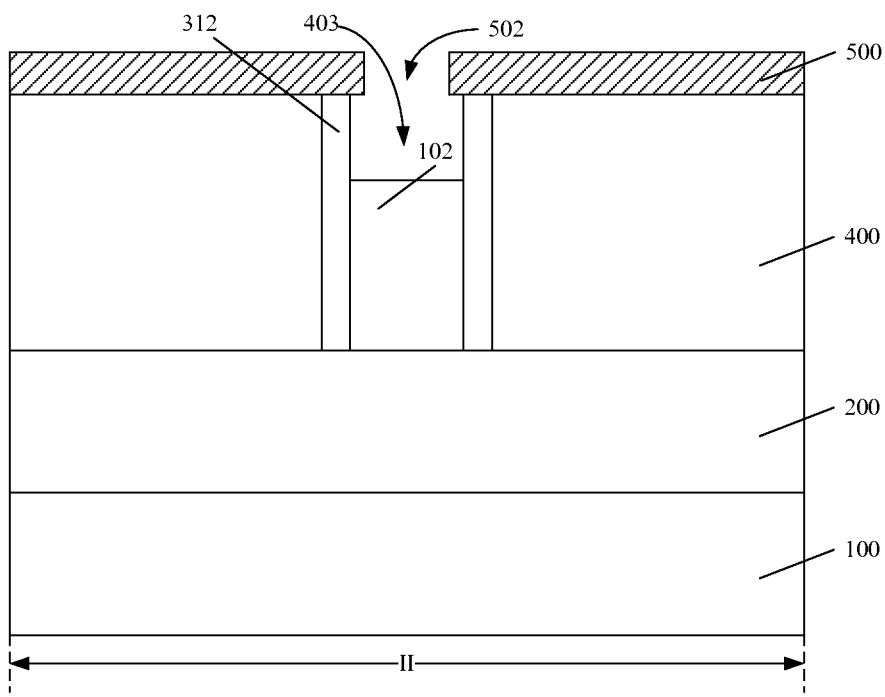

Returning to FIG. 18, as the first dummy gate structure is removed, the second dummy gate structure is also simultaneously removed through the second opening to form a third trench (S08). FIG. 14 illustrates a cross-sectional view of a corresponding structure of the exemplary static memory cell consistent with various disclosed embodiments.

As shown in FIG. 14, as the first dummy gate structure 301 (referring to FIG. 11) is removed, the second dummy gate structure 302 (referring to FIG. 12) may also be removed simultaneously through the second opening 502 to form a third trench 403.

The second dummy gate structure 302 may be removed in the same manner or similar manner as for the first dummy gate structure 301.

Figure 15:
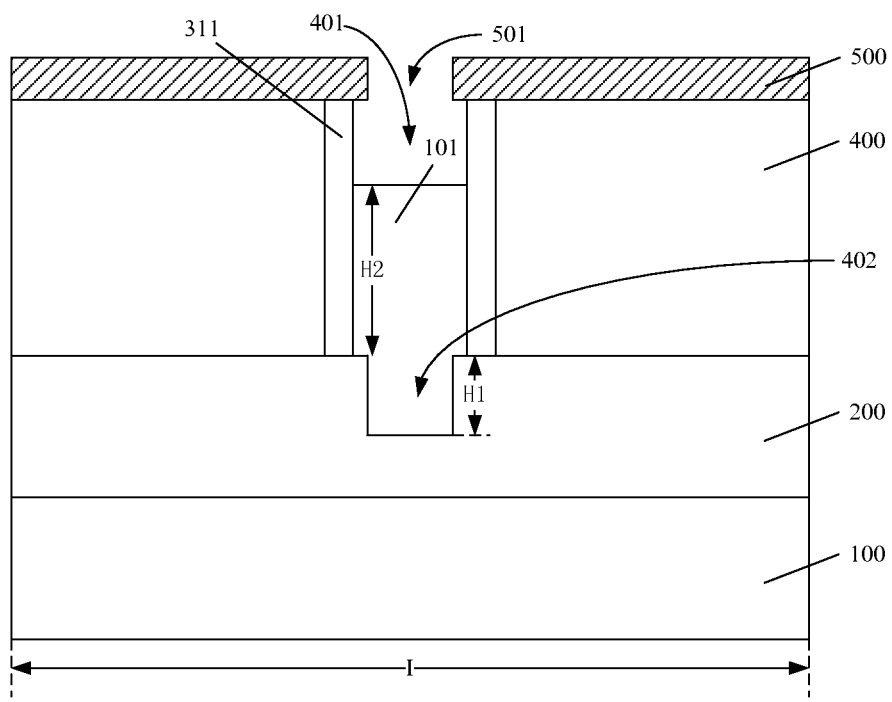

Returning to FIG. 18, portion of the thickness of the isolation layer is etched through the first opening at the bottom of the first trench to form a second trench, exposing portion of the sidewalls of the first fin part below the surface of the isolation layer (S09). FIG. 15 illustrates a cross-sectional view of a corresponding structure of the exemplary static memory cell consistent with various disclosed embodiments.

As shown in FIG. 15, portion of the thickness of the isolation layer 200 may be etched through the first opening 501 at the bottom of the first trench 401 to form a second trench 402, exposing portion of the sidewalls of the first fin part 101 below the surface of the isolation layer 200.

Before the isolation layer 200 on the first region I is etched, a protection layer may be formed on the second region II to protect the isolation layer 200 at the bottom of the third trench 403 (referring to FIG. 14) on the second region II.

An anisotropic etching process may be used to etch the isolation layer 200 through the first opening 501 to form a second trench 402. The anisotropic etching process may be a dry etching process. The dry etching process may use an etching gas such as $CF_4$, $SF_6$, $NF_3$, or other suitable fluorine-based gas.

The second trench 402 may have the same width as the first opening 501. In one embodiment, the first opening 501 has a width narrower than the width of the first trench 401. Thus, the second trench 402 has a width narrower than the width of the first trench 401. A first gate structure may be formed subsequently in the second trench 402 and the first trench 401. Because the second trench 402 has a width narrower than the width of the first trench 401, the distance between the portion of the first gate structure subsequently formed in the second trench 402 and the first source/drain electrodes on both sides of the first gate structure may be large. The large distance may reduce the leakage current between the first source/drain electrodes and the first gate structure and may improve the performance of the formed transistors.

In other embodiments, the first opening 501 may have a width equal to the width of the first trench 401. Thus, the second trench 402 formed by etching the isolation layer 200 through the first opening 501 may have the same width as the first trench 401.

The ratio between the depth H1 of the second trench 402 below than the isolation layer 200 and the height H2 of the first fin part 101 above the surface of the isolation layer 200 may be approximately 0.1 to 1. The height of the second fin part 102 exposed by the third trench 403 (referring to FIG. 14) on the second region II may be the same as the height H2 of the first fin part 101 above the surface of the isolation layer 200.

The FinFET formed on the first region I may have a channel region area larger than the channel region area of the FinFET formed on the second region II. Thus, the FinFET formed on the first region I may have a drive current larger than the drive current of the FinFET formed on the second region II. When the number of the fin parts is the same, the pull-down transistors formed on the first region I may have an increased drive current and the performance of the static memory devices may be improved.

When the ratio between the depth H1 of the second trench 402 and the height H2 of the first fin part 101 above the surface of the isolation layer 200 is 1, the FinFET formed on the first region I may have a drive current twice as much as the drive current of the FinFET formed on the second region II. The doubled drive current of the pull-down transistors meets the requirement for high performance static memory devices.

Figure 16:
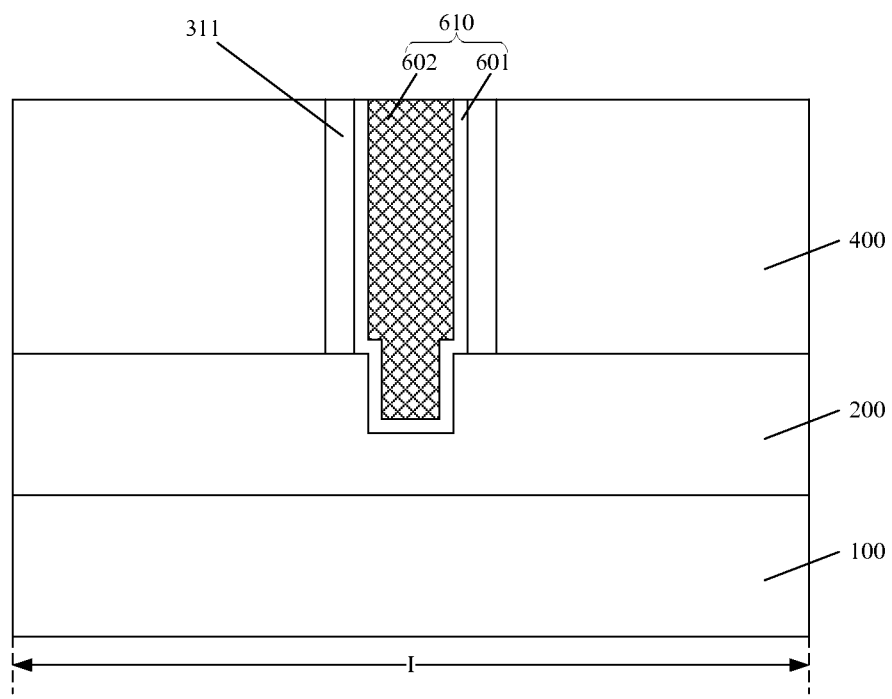

Returning to FIG. 18, after the mask layer is removed, a first gate structure is formed to fill up the first trench and the second trench (S10). FIG. 16 illustrates a cross-sectional view of a corresponding structure of the exemplary static memory cell consistent with various disclosed embodiments.

As shown in FIG. 16, after the mask layer 500 (referring to FIG. 15) is removed, a first gate structure may be formed to fill up the first trench 401 (referring to FIG. 15) and the second trench 402 (referring to FIG. 15).

Before the mask layer 500 is removed, the protection layer on the second region II may be removed. A wet etching process may be used to remove the protection layer and the mask layer 500.

The first gate structure 610 may include a first gate dielectric layer 601 located on the first fin part 101 and a first gate electrode 602 located on the first gate dielectric layer 601 and filled up the first trench 401 and the second trench 402.

The first gate dielectric layer 601 may be made of a high K dielectric material, including hafnium oxide, cobalt oxide, hafnium silicon oxide, alumina, etc. The first gate electrode 602 may be made of a metallic material, including tungsten, aluminum, titanium, tantalum, titanium nitride, tantalum nitride, tungsten nitride, etc.

To form the first gate structure 610, a gate dielectric material layer may be formed on the inner wall surfaces of the first trench 401 and the second trench 402 and on the surface of the dielectric layer 400. A gate electrode material layer may be formed on the surface of the gate dielectric material layer to fill up the first trench 401 and the second trench 402. The surface of the dielectric layer 400 may be used as an etch stop layer to planarize the gate dielectric material layer and the gate electrode material layer to form a first gate structure 610. The first gate structure 610 may have a surface coplanar with the surface of the dielectric layer 400.

In other embodiments, the first gate structure 610 may further include a first work function layer located between the first gate dielectric layer 601 and the first gate electrode 602 to adjust the work function of the formed FinFET. The first work function layer may be made of titanium nitride, tantalum nitride, etc.

After the first sidewall spacer 311 is formed, the first trench 401 and the second trench 402 may be formed. Then the first gate structure 610 may be formed in the first trench 401 and the second trench 402. The first sidewall spacer 311 may only be located on both sides of the portion of the first gate structure 610 in the first trench 401.

Compared with conventional methods, the sidewall spacer 311 may not increase the height when the first gate structure 610 increases the height. Thus, the first gate structure 610 may not increase the parasitic capacitance. When the pull-down transistors on the first region I increase the drive the current, the gate structure of the pull-down transistors may not increase the parasitic capacitance and the performance of the pull-down transistors may be improved.

Returning to FIG. 18, as the first gate structure is formed on the first region I, a second gate structure is simultaneously formed in the third trench on the second region II (S11). FIG. 17 illustrates a cross-sectional view of a corresponding structure of the exemplary static memory cell consistent with various disclosed embodiments.

As shown in FIG. 17, as the first gate structure 610 (referring to FIG. 16) is formed on the first region I, a second gate structure 620 may be simultaneously formed in the third trench 403 (referring to FIG. 14) on the second region II In the process of forming the first gate structure 610, the gate dielectric material layer may also cover the inner wall surface of the third trench 403. The gate electrode material layer located on the surface of the gate dielectric material layer may also fill up the third trench 403. The gate dielectric material layer and the gate electrode material layer may be planarized to simultaneously form the first gate structure 610 and the second gate structure 620.

The second gate structure 620 may include a second gate dielectric layer 603 located on the second fin part 102 and a second gate electrode 604 located on the surface of the second gate dielectric layer 603 and filled up the third trench 403.

In other embodiments, the second gate structure 620 may further include a second work function layer located between the second gate electrode 604 and the second gate dielectric layer 603 to adjust the work function of the formed FinFET. The second work function layer may be made of titanium nitride, tantalum nitride, etc.

The present disclosure may form the pull-down transistors with increased drive current in a static memory cell on the conditions that the number of first fin parts 101 on the first region I remain the same and the gate parasitic capacitance of the pull-down transistors remain the same as well. Further, as the high drive current pull-down transistors are formed on the first region I, other low drive current transistors in a static memory cell may be simultaneously formed on the second region II. The present disclosure may improve the performance and the density of the static memory devices.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method of forming a static memory cell, comprising:
providing a semiconductor substrate including a first region,
forming a first fin part on the semiconductor substrate in the first region;
forming an isolation layer on the semiconductor substrate, having a top surface lower than a top surface of the first fin part to cover a lower portion of a sidewall surface of the first fin part;
forming a first dummy gate structure across a length of the first fin part;
forming a first sidewall spacer on the sidewall surface of the first dummy gate structure and on a surface portion of the isolation layer;
forming a dielectric layer on the isolation layer and having a top surface coplanar with a top surface of the first dummy gate structure;
forming a mask layer on the dielectric layer and on the top surface of the first dummy gate structure, wherein the mask layer contains a first opening to expose the top surface of the first dummy gate structure;
removing the first dummy gate structure through the first opening to form a first trench exposing a portion of a surface of the first fin part and the sidewall spacer located on both sides of the first fin part;
removing a portion of a thickness of the isolation layer at the bottom of the first trench through the first opening to form a second trench exposing a portion of sidewalls of the first fin part beneath the top surface of the isolation layer; and
forming a first gate structure by filling up the first trench and the second trench in the first region.

2. The method of claim 1, wherein:
the first opening contained in the mask layer has a width narrower than a width of the first dummy gate structure.

3. The method of claim 2, wherein:
the first opening in the mask layer has the width approximately from ½ to ⅘ of the width of the first dummy gate structure.

4. The method of claim 2, wherein:
the first dummy gate structure has the width approximately from 20 nm to 25 nm and the first opening has the width approximately from 15 nm to 20 nm.

5. The method of claim 2, wherein:
the second trench has a width narrower than the width of the first trench.

6. The method of claim 2, wherein the step of removing the first dummy gate includes:
anisotropically etching to remove a portion of the first dummy gate structure through the first opening to expose the portion of the surface of the first fin part, and
isotropically etching to remove a remaining portion of the first dummy gate structure underneath the mask layer on both sides of the first opening.

7. The method of claim 6, wherein:
the anisotropic etching process is a dry etching process; and
the isotropic etching process is a wet etching process.

8. The method of claim 1, wherein:
the first dummy gate structure further includes a first dummy gate dielectric layer located between the first fin part and the first dummy gate electrode and the first dummy gate dielectric layer is made of silicon oxide.

9. The method of claim 8, wherein:
the anisotropic etching process has a pressure ranging approximately from 10 mTorr to 50 mTorr, a power ranging approximately from 500 W to 750 W, a $CF_4$ gas flow rate ranging approximately from 50 sccm to 200 sccm, a HBr gas flow rate ranging approximately from 100 sccm to 1000 sccm, a He gas flow rate ranging approximately from 200 sccm to 1000 sccm, an $O_2$ gas flow rate ranging approximately from 5 sccm to 20 sccm, a temperature ranging approximately from 40° C. to 80° C., and a bias voltage ranging approximately from 100 V to 250 V.

10. The method of claim 8, wherein:
the isotropic etching process has an etching solution of tetramethyl ammonium hydroxide, a mass concentration ranging approximately from 1% to 5%, and a temperature ranging approximately from 50° C. to 80° C.

11. The method of claim 1, wherein:
the first opening in the mask layer has a width equal to the width of the first dummy gate structure, and
the second trench has a width equal to the width of the first trench.

12. The method of claim 11, wherein:
the first dummy gate structure is removed through the first opening by using an anisotropic etching process.

13. The method of claim 1, wherein:
by using an anisotropic etching process, the isolation layer is etched through the first opening and the portion of the thickness of the isolation layer at the bottom of the first trench is removed to form the second trench.

14. The method of claim 1, wherein:
a ratio between a height of the first fin part above the top surface of the isolation layer and a depth of the second trench ranges approximately from 0.1 to 1.

15. The method of claim 1, further including:
forming a second fin part on the semiconductor substrate in a second region, wherein the second fin part has the same height as the first fin part,
covering a lower portion of sidewalls of the second fin part by the isolation layer,
simultaneously forming a second sidewall spacer located on a sidewall surface of the second dummy gate structure, while forming the first sidewall spacer,
forming a second opening on the mask layer to expose the top surface of the second dummy gate structure,
simultaneously removing the second dummy gate structure through a second opening in the mask layer to form a third trench in the second region, while removing the first dummy gate structure through the first opening,
before forming the second trench in the first region, forming a protection layer on the second region to protect the isolation layer on the second region,
after forming the second trench in the first region, removing the protection layer in the second region, and
simultaneously forming a second gate structure on the second region to fill up the third trench, while forming the first gate structure in the first region.

16. The method of claim 15, wherein:
the first gate structure includes a first gate dielectric layer located on the first fin part, and a first gate electrode located on the first gate dielectric layer to fill up the first trench and the second trench; and
the second gate structure includes a second gate dielectric layer located on the second fin part, and a second gate electrode located on the second gate dielectric layer to fill up the third trench.

17. The method of claim 16, wherein:
the first gate structure further includes a first work function layer located between the first gate electrode and the first gate dielectric layer; and
the second gate structure further includes a second work function layer located between the second gate electrode and the second gate dielectric layer.

* * * * *